(12) United States Patent
Yang et al.

(10) Patent No.: US 12,198,910 B2
(45) Date of Patent: Jan. 14, 2025

(54) PERMEANCE MAGNETIC ASSEMBLY

(71) Applicant: Taiwan Semiconductor Manufacturing Co., Ltd., Hsin-Chu (TW)

(72) Inventors: Tsung-Jen Yang, Hsin-Chu (TW); Yi-Zhen Chen, Hsin-Chu (TW); Chih-Pin Wang, Hsin-Chu (TW); Chao-Li Shih, Jhudong Township (TW); Ching-Hou Su, Hsinchu (TW); Cheng-Yi Huang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 18/513,313

(22) Filed: Nov. 17, 2023

(65) Prior Publication Data

US 2024/0087861 A1    Mar. 14, 2024

Related U.S. Application Data

(60) Continuation of application No. 17/876,422, filed on Jul. 28, 2022, now Pat. No. 11,854,776, which is a division of application No. 16/596,109, filed on Oct. 8, 2019, now Pat. No. 11,488,814.

(60) Provisional application No. 62/751,896, filed on Oct. 29, 2018.

(51) Int. Cl.
  *H01J 37/34* (2006.01)
  *C23C 14/35* (2006.01)

(52) U.S. Cl.
  CPC .......... *H01J 37/3408* (2013.01); *C23C 14/35* (2013.01); *H01J 37/3458* (2013.01); *H01J 2237/152* (2013.01)

(58) Field of Classification Search
  CPC ............... H01J 37/3408; H01J 37/3458; H01J 2237/152; C23C 14/35; C23C 14/3407
  See application file for complete search history.

(56) References Cited

U.S. PATENT DOCUMENTS

| | | | |
|---|---|---|---|
| 5,290,416 A | 3/1994 | Tong et al. | |
| 5,593,551 A | 1/1997 | Lai | |
| 5,919,345 A | 7/1999 | Tepman | |
| 6,146,509 A | 11/2000 | Aragon | |
| 6,299,740 B1 | 10/2001 | Hieronymi et al. | |
| 6,402,903 B1 | 6/2002 | Jiang et al. | |
| 9,754,771 B2 | 9/2017 | West et al. | |
| 2001/0022271 A1 | 9/2001 | Cord et al. | |
| 2003/0178299 A1 | 9/2003 | Shin et al. | |
| 2005/0103619 A1 | 5/2005 | Stelter et al. | |
| 2014/0265857 A1 | 9/2014 | Park et al. | |

*Primary Examiner* — James Lin
*Assistant Examiner* — Patrick S Ott
(74) *Attorney, Agent, or Firm* — Duane Morris LLP

(57) ABSTRACT

In an embodiment, a magnetic assembly includes: an inner permeance annulus; and an outer permeance annulus connected to the inner permeance annulus via magnets, wherein the outer permeance annulus comprises a peak region with a thickness greater than other regions of the outer permeance annulus.

20 Claims, 8 Drawing Sheets

PERMEANCE MAGNETIC ASSEMBLY

CROSS-REFERENCE TO RELATED APPLICATIONS

This application is continuation of U.S. patent application Ser. No. 17/876,422, filed Jul. 28, 2022, which is a division of U.S. patent application Ser. No. 16/596,109, filed Oct. 8, 2019, which claims priority benefit of U.S. Provisional Application No. 62/751,896, filed on Oct. 29, 2018, the contents of each are incorporated by reference in their entireties.

BACKGROUND

Physical vapor deposition (PVD) is a conventionally used process for deposition of materials atop a wafer (e.g., a substrate, semiconductor workpiece, or semiconductor device). A conventional PVD process illustratively includes bombarding a target comprising a source material with ions from a plasma of an inert gas having relatively heavy atoms (e.g., argon (Ar)) or a gas mixture comprising such inert gas. This bombardment may cause the source material to be sputtered from the target. The ejected source material may be accelerated towards the substrate via a negative voltage or bias formed on the wafer, resulting in a deposition of the source material atop the wafer. During the PVD process a magnetron may be rotated within a water filled cavity, near a backside of the target to facilitate sputtering.

Various improvements have been introduced to improve the process of PVD. Such improvements may relate to design of the target and the vacuum chamber. However, such means alone may not address the increasingly strict requirements for effective PVD. Therefore, conventional techniques of PVD are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
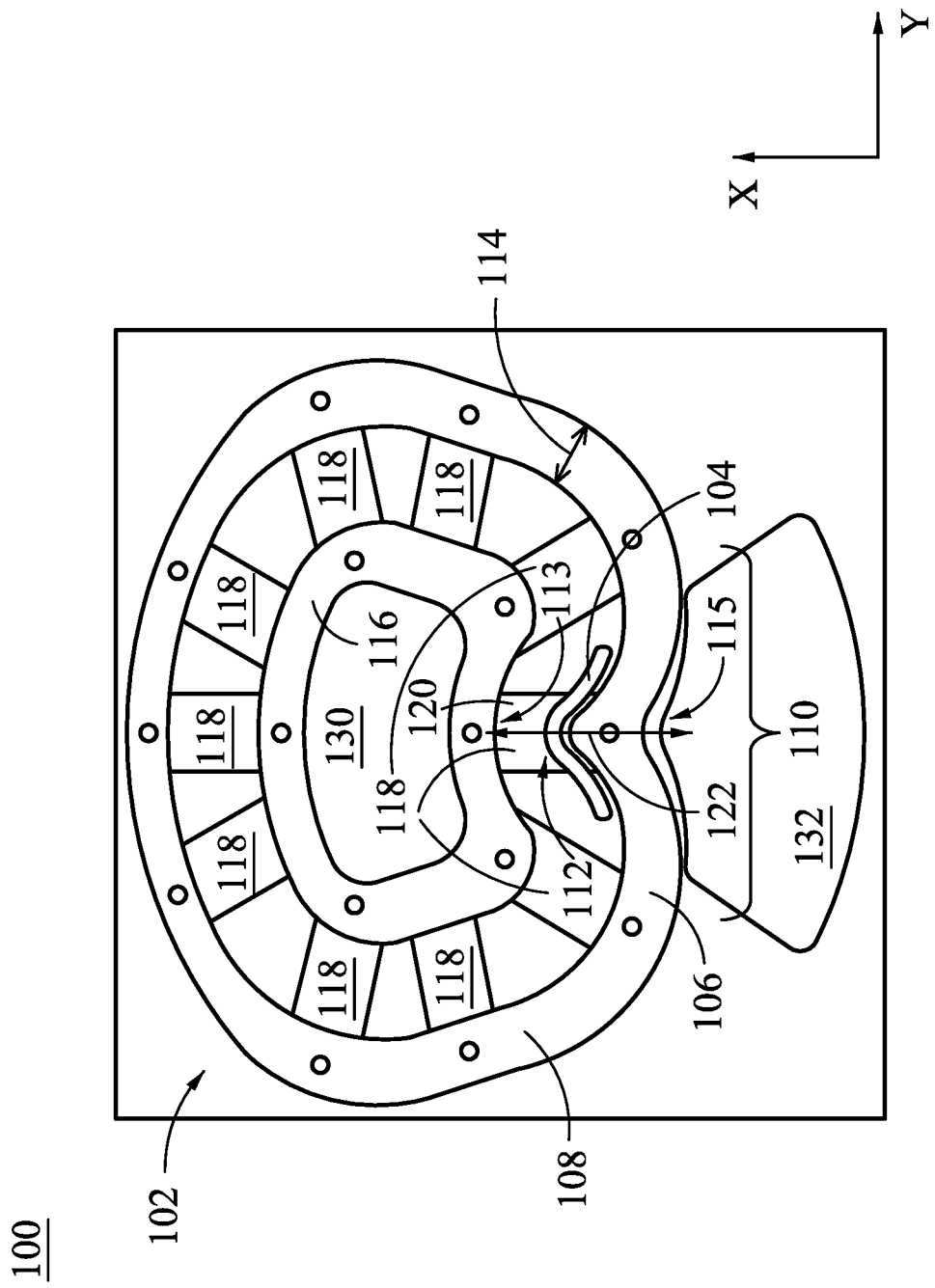
FIG. 1A is a bottom view diagram of a permeance enhanced magnetic assembly with a permeance extension structure that is a separate piece adhered to a main structure of the outer permeance annulus, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As introduced above, physical vapor deposition (PVD) chambers may include a spinning magnetron that may produce an electromagnetic field to sputter a target to release source material from the target for deposition on a wafer within the PVD chamber. Accordingly, the sputtering of a target also erodes the target, causing the target to lose source material.

Magnetrons may be rotated around an axis and create a uniform electromagnetic field with respect to an axis of rotation. However, design considerations for such electromagnetic fields typically do not take into consideration the unique features of different targets and PVD chambers. For example, different targets and different chambers may cause an electromagnetic field, which might be uniform in a vacuum (e.g., with a consistent electromagnetic field strength at a particular distance from the magnetron), to not be uniform within the chamber and thus sputter and erode a target in a non-uniform way. Also, different targets may be eroded in different ways and thus have different erosion profiles.

Targets may become unusable, or more difficult to use, when parts of a target become completely eroded even while other parts of the target are not completely eroded. For example, non-uniform target erosion may be characterized by a target which erodes faster at some points than others. These points may form depressions. An example of a depression may include dips, troughs, or valleys, along the surface of the target characterized by a localized low point surrounded by higher points along the surface. Another example of a depression may include a lower point along the surface of a target that surrounds a high point, or peak. With increased sputtering (e.g., due to greater magnetic field strength and/or use over a longer duration of time) the parts of the target with depressions may erode entirely through the target such that the target is devoid of material at and around the area that the depression forms. This area that becomes devoid of material may be referred to as a target puncture. Target punctures may render a target unusable or undesirable (e.g., due to reduced sputtering efficacy) such that the source material not yet sputtered is discarded and thus wasted. Target punctures may be caused by an uneven gradient of erosion over time at a target. An uneven gradient of erosion over time, or uneven erosion, may be characterized by a localized area of a target having a rate of erosion unmatched elsewhere to allow the vertical level of source material at the localized area to be even with other areas of the target.

Accordingly, the present disclosure provides various embodiments of permeance enhanced magnetic assemblies that may be designed to produce an even or uniform electromagnetic field or pattern that sputters a target to avoid target punctures. By avoiding target punctures, the target may be eroded along an even gradient (e.g., at a rate to avoid puncture) over time. These permeance enhanced magnetic assemblies may replace traditional magnetrons which do not sputter a target in a manner that considers or avoids target punctures. The permeance enhanced magnetic assemblies may include a permeance enhanced peak region. This permeance enhanced peak region may be a peak region of a magnetic assembly that includes a permeance extension structure that is a separate piece adhered to another piece of the outer permeance annulus of the magnetic assembly or that is an integrated piece (e.g., not a separate piece) that juts laterally from the surface of the permeance annulus of the magnetic assembly. The geometry (e.g., shape and/or volume) of the permeance enhanced peak region may be modified based on an understanding of an erosion profile of a particular target (e.g., target erosion profile) in the context of a particular PVD chamber. For example, the permeance enhanced peak region of a permeance enhanced magnetic assembly may be designed to produce an electromagnetic field that sputters a target for even target erosion in a particular PVD chamber. Stated another way, an initial target erosion profile for a target may be determined and then modified (e.g., by modifying a geometry (e.g., shape and/or volume) of the permeance enhanced peak region) to produce a target erosion profile for the target with erosion that avoids target punctures.

A target erosion profile may be indicative of how an electromagnetic field facilitates sputtering of a target. For example, depressions or a target puncture may indicate regions along the target where the electromagnetic field is stronger than other regions. Accordingly, an electromagnetic field at the regions with known depressions or target puncture, for a particular target and/or PVD chamber, may be reduced to be even with other regions of the electromagnetic field. Alternatively, an electromagnetic field at the regions without known depressions or target punctures, for a particular target and/or PVD chamber, may be increased to be even with other regions of the electromagnetic field.

In certain embodiments, the target erosion profile may be determined using a sensor to collect sensor data that may characterize electromagnetic fields within the PVD chamber, magnetic flux through a target, target depressions, target punctures, and the like. For example, a measuring instrument sensor may be utilized to measure the electromagnetic field for a given magnetron (e.g., unmodified magnetic assembly), target, and PVD chamber. Also, the same or different measuring instrument sensor may be utilized to measure physical contours on the target over time to confirm specific target depressions and/or target punctures for the given magnetron, target, and PVD chamber. Accordingly, the relationship between the electromagnetic field and target depressions and/or target punctures may be utilized to characterize a target erosion profile for a specific target, magnetron, and PVD chamber.

Based on the determined target erosion profile, a permeance enhanced magnetic assembly may be designed to achieve more uniform or even target erosion to avoid target punctures. For example, based on the detected target erosion profile, modifications for the unmodified magnetic assembly (e.g., magnetron used to determine the target erosion profile) may be modeled to determine modifications that may produce a permeance enhanced magnetic assembly with an electromagnetic field that erodes a target evenly (e.g., erodes a target along an even gradient over time) via sputtering to avoid target punctures. Specifically, this modeling may be performed by comparing how different modifications of the unmodified magnetic assembly may affect the target erosion profile. For example, this modeling may determine whether calibration as an increase and/or decrease in electromagnetic field strength at particular areas would affect the previously determined target erosion profile. These increases and/or decreases in electromagnetic field strength may be equated to modifications of the geometry (e.g., shape and/or volume) of the permeance enhanced peak region. In certain embodiments, this modeling may be executed in an automated fashion utilizing conventional computer modeling. In other embodiments, this modeling may be executed manually by manually modifying at least one constituent magnet and then utilizing sensors to reassess a resultant electromagnetic field and physical contours on the target over time. Based on the modeling, a particular configuration of the geometry of the permeance enhanced peak region may be determined to achieve even erosion of the target during sputtering over time to avoid target punctures.

Calibration of the strength of the electromagnetic field produced by the permeance enhanced magnetic assembly may be performed by modifying the geometry (e.g., shape and/or volume) of the permeance enhanced peak region of the permeance enhanced magnetic assembly. For example, the strength of an electromagnetic field produced by the permeance enhanced magnetic assembly at a particular region of the target may be calibrated by changing the geometry of the permeance enhanced peak region (e.g., by making the permeance enhanced peak region bigger or smaller, or by changing the curvature, length, width, and/or thickness of the permeance enhanced peak region). In certain embodiments, this permeance enhanced peak region may be changed by including a permeance extension structure to affect the desired electromagnetic field.

In certain embodiments, a magnetic assembly may include an inner permeance annulus and an outer permeance annulus connected to the inner permeance annulus via magnets. The outer permeance annulus may include a permeance enhanced peak region with a thickness greater than other regions of the outer permeance annulus. This permeance enhanced peak region may include a permeance extension structure that is a separate piece adhered to another part of the enhanced peak region (e.g., not formed as a single continuous piece but subsequently assembled together). Alternatively, the permeance extension structure may be a single continuous piece (e.g., formed as a single continuous piece without subsequent assembly after formation) with the rest of the enhanced peak region. This permeance enhanced peak region may include a convex feature along the outer permeance annulus facing a concave feature along the inner permeance annulus. In certain embodiments, the permeance enhanced peak region may be aligned with a magnet, such that an axis bisecting the magnet also bisects the permeance enhanced peak region and the permeance extension structure. Also, the permeance enhanced peak region, and more specifically the permeance extension structure, may include a tip that extends more toward the inner permeance annulus than other parts of the outer permeance annulus. In particular embodiments, the permeance enhanced peak region, and more specifically the permeance extension structure, may include a width that is greatest among the outer permeance annulus. In certain embodiments, the outer permeance annulus may include a varying width but a uniform thickness. In particular embodiments, the permeance extension structure may be made of a same, or different, material as other parts of the outer permeance annulus. For example, the permeance extension structure may be made of stainless steel.

As noted above, the geometry of the permeance extension structure may be modified as desired to calibrate the strength of the electromagnetic field produced by the permeance enhanced magnetic assembly. In certain embodiments, the curvature of the permeance extension structure may have a radius of curvature of about 9 to about 15. Also, a length of the permeance extension structure may be from about 10 millimeters (mm) to about 80 mm. Furthermore, a width of the permeance extension structure may be from about 3 mm to about 9 mm. Additionally, a thickness of the permeance extension structure may be from about 2 mm to about 9 mm.

FIG. 1A is a bottom view diagram 100 of a permeance enhanced magnetic assembly 102 with a permeance extension structure 104 that is a separate piece adhered to a main structure 106 of the outer permeance annulus 108, in accordance with some embodiments. The main structure 106 may be another piece of the outer permeance annulus 108 to which the separate piece permeance extension structure 104 is adhered to. Accordingly, the outer permeance annulus 108 may be a combination of the main structure 106 and the permeance extension structure 104, each formed as separate pieces and subsequently assembled. The separate piece permeance extension structure 104 may be adhered to the main structure 106 of the outer permeance annulus 108 in any of a variety of ways, such as via an adhesive (e.g., glue, cement, mucilage, paste, or the like), via a mechanical fastener (e.g., bolts, battens, bolts, buckles, clamps, and the like) and/or any other technique of joining materials together such as crimping, welding, soldering, brazing, taping, and the like. In particular embodiments, the adherence of the separate piece permeance extension structure 104 to the main structure 106 may not be entirely flush or continuous, such that each may substantially be physically separate but joined at certain points, such as via bolts. In certain embodiments, the main structure 106 may be a same material as that of the permeance extension structure 104. However, in other embodiments, the main structure 106 may be of a different material than that of the permeance extension structure. In particular embodiments, the permeance extensions structure may be made of steel (e.g., stainless steel).

Furthermore, the permeance extension structure 104 may be located within a permeance enhanced peak region 110. This permeance enhanced peak region 110 may refer to a region of the outer permeance annulus 108 that includes a peak 112. The peak 112 may be a convex feature of the outer permeance annulus 108 that is the most convex among the structure of the outer permeance annulus 108. Also, permeance enhanced peak region 110 may include a concave feature 115 of the outer permeance annulus 108 that is the most concave among the structure of the outer permeance annulus 108. Accordingly, the enhanced peak region 110 may span from parts of the outer permeance annulus 108 at which the concave feature and convex feature are formed. In certain embodiments, the enhanced peak region 110 may have a width 114 (e.g., along a plane or dimension substantially defined by an X and Y axis aligned with a surface of the outer permeance annulus 108) that is greater than other regions of the outer permeance annulus 108. Furthermore, in particular embodiments, the outer permeance annulus 108 may include a varying width but a uniform thickness (e.g., along an axis orthogonal to the width).

In various embodiments, a tip of the peak 112 may face an inner permeance annulus 116. More specifically, the tip of the peak 112 may face a concave region 113 of the inner permeance annulus 116. Accordingly, the permeance enhanced peak region 110 of the outer permeance annulus 108, and more specifically the permeance extension structure 104, may form the tip of the peak 112 that extends more toward the inner permeance annulus 116 than other parts of the outer permeance annulus 108.

The inner permeance annulus 116 may be connected with the outer permeance annulus 108 via a magnet set 118 of multiple individual magnets 118 (e.g., 10 individual magnets). A bridge magnet 120 (e.g., one of the magnets) of the magnet set 118 may be aligned with the peak 112 (e.g., the permeance extension structure 104) such that a central axis 122 bisecting the bridge magnet also bisects the permeance enhanced peak region and the permeance extension structure. In certain embodiments, the central axis 122 may also bisect the permeance enhanced magnetic assembly 102.

Based on the connection with the magnet set 118, the inner permeance annulus 116 may function as a south pole and the outer permeance annulus 108 may function as a north pole of the permeance enhanced magnetic assembly 102. Stated another way, a north pole end of the magnet set 118 may contact the outer permeance annulus 108 and a south pole end of the magnet set 118 may contact the inner permeance annulus 116. Furthermore, the magnet set 118 may be connected with a pedestal 130 that may be connected with a shaft for rotating the permeance enhanced magnetic assembly 102. The pedestal 130 may also be attached with a counterweight 132 to the permeance enhanced magnetic assembly 102.

Figure 1B:
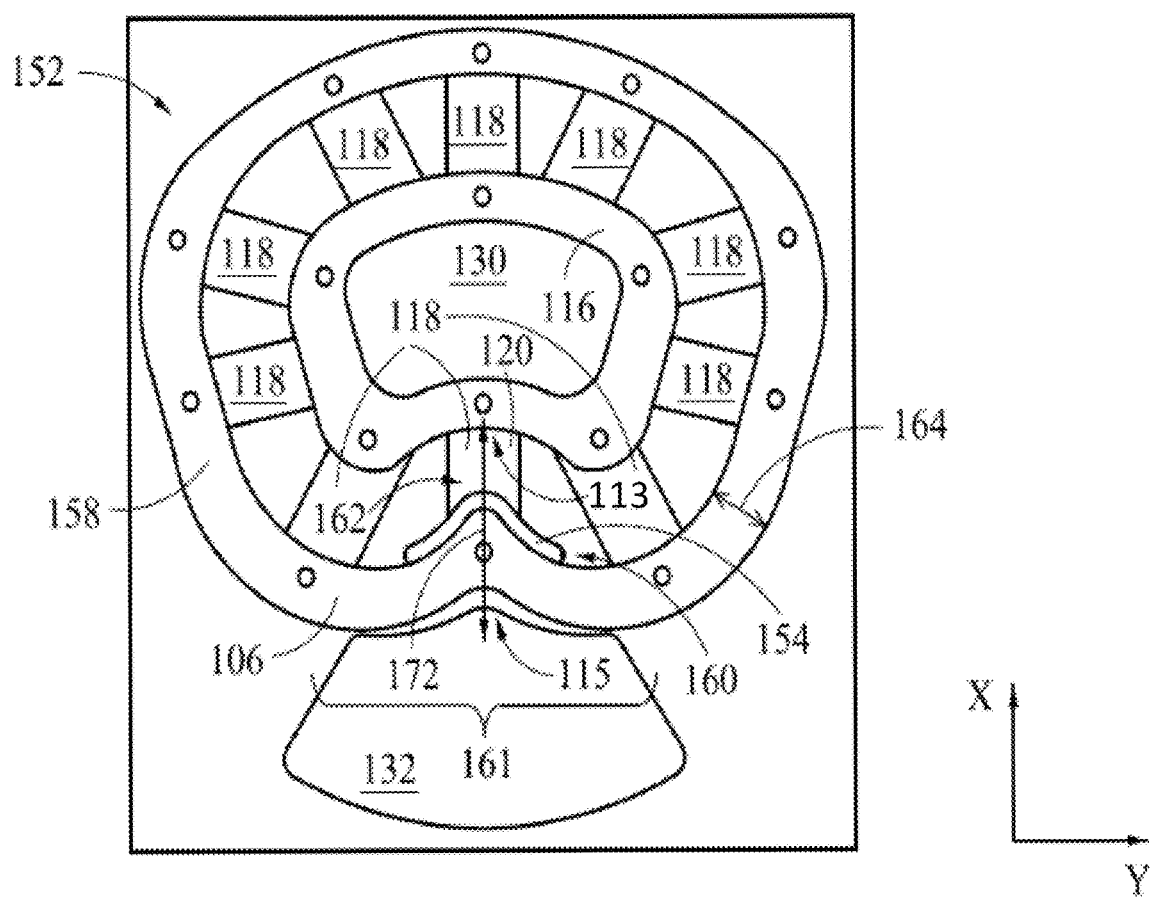
FIG. 1B is a bottom view diagram of a permeance enhanced magnetic assembly with a permeance extension structure that is a continuous with the outer permeance annulus, in accordance with some embodiments.

FIG. 1B is a bottom view diagram 150 of a permeance enhanced magnetic assembly 152 with a permeance extension structure 154 that is a continuous with the outer permeance annulus 158, in accordance with some embodiments. Stated another way, the permeance extension structure 104 is a continuous structural feature of the outer permeance annulus 158. This permeance extension structure 154 may jut out from the rest of the outer permeance annulus 158 such that the permeance extension structure 154 forms at least one inside corner 160 with the rest of the outer permeance annulus 158. This inside corner 160 may be a corner formed by two intersecting surfaces at an angle measured from the outside (e.g., external to the outer permeance annulus 158) of less than 180 degrees. For example, the inside corner may be any of 30 degrees, 45 degrees, 60 degrees, 90 degrees, 120 degrees, 135 degrees, or 140 degrees. In certain embodiments, an inside corner may be at a right angle. In various embodiments, the inside corner 160 may be a tapered sidewall. For example, the inside corner 160 may be tapered such that the corner forms a curve that relates two surfaces together at less than 180 degrees (e.g., where respective tangent lines of the two surfaces are less than 180 degrees apart).

As introduced above, the permeance extension structure 154 may be located within a permeance enhanced peak region 161. This permeance enhanced peak region 161 may refer to a region of the outer permeance annulus 158 that includes a peak 162. The peak 162 may be a convex feature of the outer permeance annulus 158 that is the most convex among the structure of the outer permeance annulus 158. Also, permeance enhanced peak region 161 may include a concave feature of the outer permeance annulus 158 that is the most concave among the structure of the outer permeance annulus 158. Accordingly, the enhanced peak region 161 may span from parts of the outer permeance annulus 158 at which the concave feature and convex feature are formed. In certain embodiments, the enhanced peak region 161 may have a width 164 (e.g., along a plane substantially defined by an X and Y axis (e.g., an X and Y dimension) aligned with a surface of the outer permeance annulus 158) that is greater than other regions of the outer permeance annulus 158. Furthermore, in particular embodiments, the outer permeance annulus 158 may include a varying width but a uniform thickness (e.g., along an axis orthogonal to the width, also referred to as a Z axis or dimension).

In various embodiments, a tip of the peak 162 may face an inner permeance annulus 116. More specifically, the tip of the peak 162 may face a concave region 113 of the inner permeance annulus 116. Accordingly, the permeance enhanced peak region 161 of the outer permeance annulus 158, and more specifically the permeance extension structure 154, may form the tip of the peak 162 that extends more toward the inner permeance annulus 116 than other parts of the outer permeance annulus 158.

The inner permeance annulus 116 may be connected with the outer permeance annulus 158 via a magnet set 118 of multiple individual magnets 118 (e.g., 10 magnets). A bridge magnet 120 (e.g., one of the magnets) of the magnet set 118 may be aligned with the peak 162 (e.g., the permeance extension structure 154) such that a central axis 172 bisecting the bridge magnet also bisects the permeance enhanced peak region and the permeance extension structure. In certain embodiments, the central axis 172 may also bisect the permeance enhanced magnetic assembly 152.

Based on the connection with the magnet set 118, the inner permeance annulus 116 may function as a south pole and the outer permeance annulus 158 may function as a north pole of the permeance enhanced magnetic assembly 152. Furthermore, the magnet set 118 may be connected with a pedestal 130 that may be connected with a shaft for rotating the permeance enhanced magnetic assembly 152. The pedestal 130 may also be attached with a counterweight 132 to the permeance enhanced magnetic assembly 152.

Figure 1C:
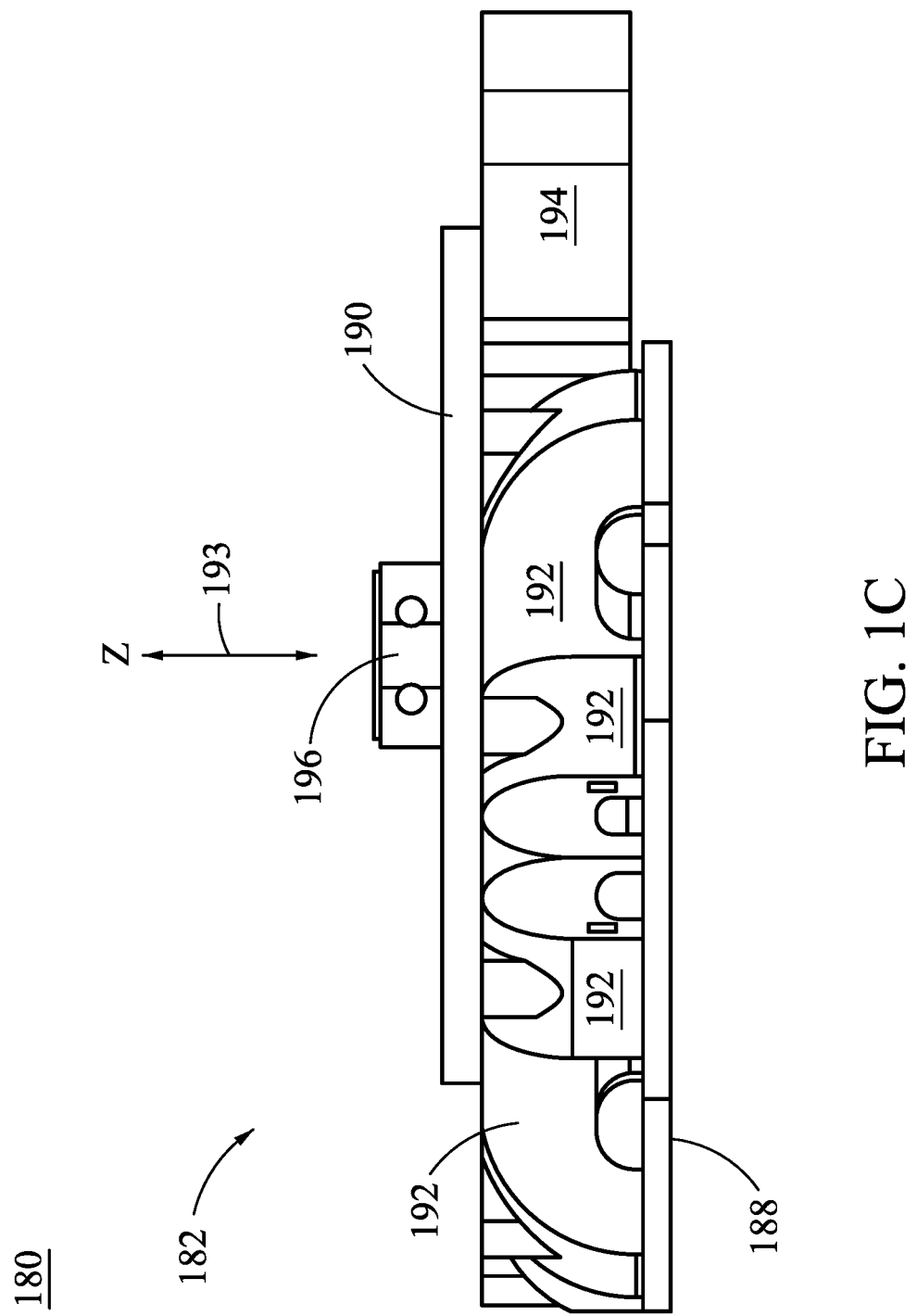
FIG. 1C is a side view diagram of a permeance enhanced magnetic assembly, in accordance with some embodiments.

FIG. 1C is a side view diagram 180 of a permeance enhanced magnetic assembly 182, in accordance with some embodiments. As illustrated, the permeance enhanced magnetic assembly 182 may include an outer permeance annulus 188 (e.g., similar to the outer permeance annulus 158 or outer permeance annulus 108 discussed above). The outer permeance annulus 188 may be connected with a pedestal 190 (e.g., similar to the pedestal 130 discussed above) via magnets 192 (e.g., similar to the magnets 118 discussed above) along a Z axis 193. The pedestal 190 may also be attached with a counterweight 194 (similar to the counterweight 132 discussed above) to the permeance enhanced magnetic assembly 152. Each of the magnets 192 may include a U shape (e.g., shaped with a U) in which one end of the magnets 192 are connected with the outer permeance annulus 188 and the other end of the magnets 192 are connected with an inner permeance annulus, as noted above. Also, the outer permeance annulus 188 may function as a north pole while the inner permeance annulus may function as a south pole. The pedestal 190 may include an interface structure 196 from which the pedestal 190 may interface with a shaft to spin the permeance enhanced magnetic assembly 182 about the Z axis 193.

Figure 2:
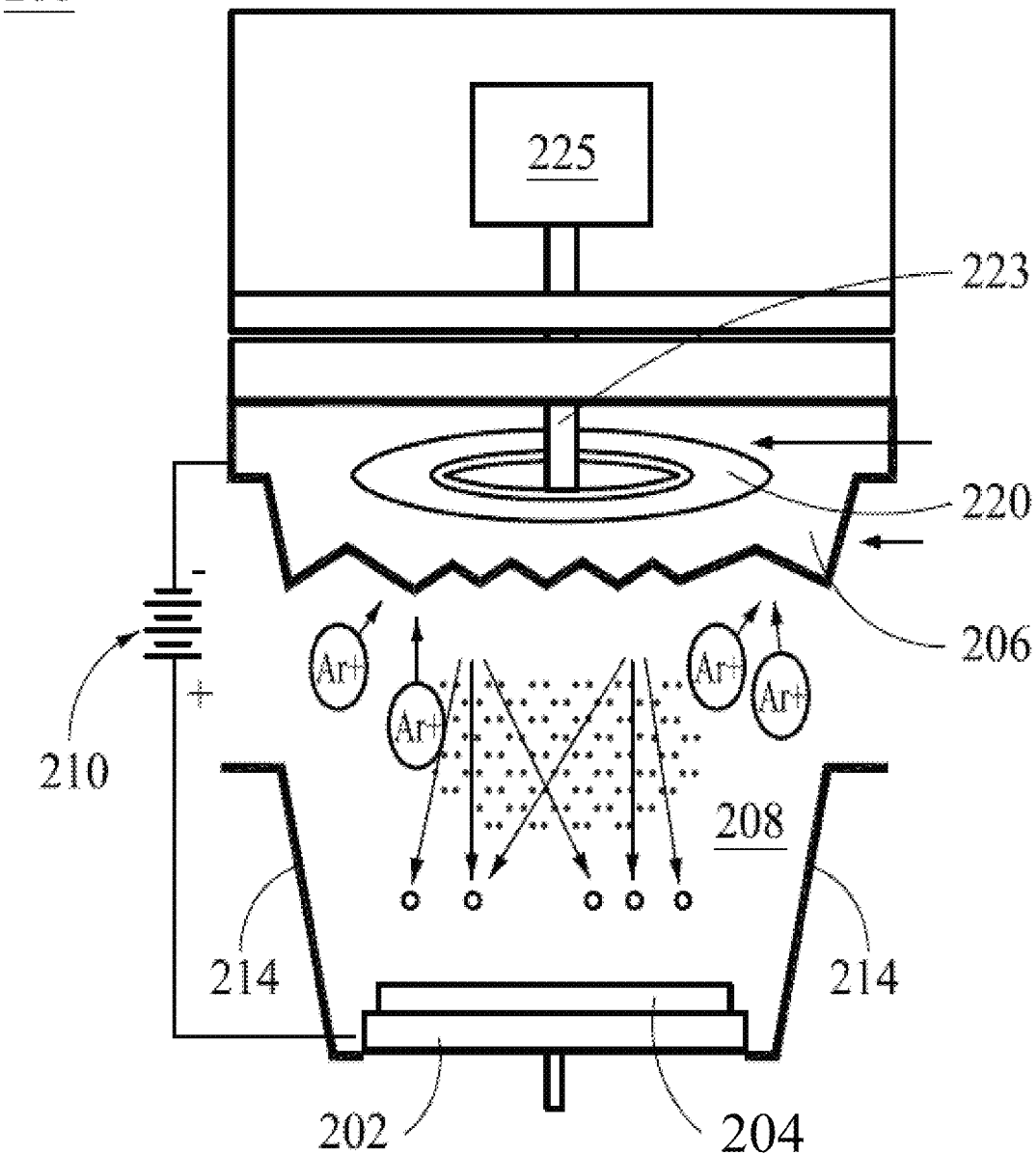
FIG. 2 is a cross sectional illustration of a physical vapor deposition chamber, in accordance with some embodiments.

FIG. 2 is a cross sectional illustration of a physical vapor deposition (PVD) chamber 200, in accordance with some embodiments. The chamber 200 may be any suitable PVD chamber configured for direct current (DC), and optionally radio frequency (RF), power. In some embodiments, the chamber 200 may be configured for both DC and RF power application, as discussed below. For example, the chamber 200 may include a heater or electrostatic chuck 202 on which a wafer 204 may be disposed. An electrode may be disposed in the electrostatic chuck 202 for providing RF power to the process chamber 208. The process chamber 208 may be enclosed but, for simplicity of illustration, the process chamber 208 is not illustrated with enclosing lines or walls. The RF power may be supplied to the electrode via an RF power supply. The RF power supply may be coupled to the electrode. Alternatively or in combination, the RF power supply (or another RF power supply) may be coupled to a target 206 disposed above the electrostatic chuck 202 (or to an electrode disposed proximate a backside of the target), for example, in a ceiling of the process chamber 208 of the PVD chamber 200.

The target 206 may comprise source material that is any suitable metal and/or metal alloy for use in depositing a layer on the wafer 204. For example, in some embodiments, the target 206 may comprise tungsten (W), copper (Cu), tantalum (Ta), silicon (Si), tantalum nitride (Ta(N)), titanium (Ti), aluminum copper (Al Cu) alloy, copper aluminum (Cu Al) alloy, and titanium aluminum (Ti Al) alloy. In particular embodiments, the target 206 may include combinations of the above referenced source materials. In certain embodiments, the target 206 may be configured to occupy a specific region of the chamber 200 referred to as a target region. The target region may be fully occupied by (e.g., coextensive with) the target 206 when the target 206 is disposed within the target region.

A DC power supply 210 may be coupled to the target 206 to provide a bias voltage on the target 206 to direct a plasma formed in the process chamber 208 towards the target 206. The plasma may be formed from a process gas, such as argon (Ar) or the like, provided to the process chamber 208 by a gas source. Although illustrated as outside of shields 214 within the process chamber 208 that contains the plasma reaction, the gas source may be directly connected to a region within the shield 214 in other embodiments. A vacuum pump may also assist in regulation of the gaseous environment of the process chamber 208.

As noted above, a permeance enhanced magnetic assembly 220 may include a pedestal connected with a shaft 223 for rotating the permeance enhanced magnetic assembly 220. The pedestal may also be attached with a counterweight to the permeance enhanced magnetic assembly 220. The permeance enhanced magnetic assembly 220 may be disposed above the target 206. A liquid cooling inlet and a liquid cooling outlet may provide cooling liquid for the permeance enhanced magnetic assembly 220 during operation of the permeance enhanced magnetic assembly 220. In certain embodiments, this cooling liquid is deionized water (DIW). The permeance enhanced magnetic assembly 220 may, for example, facilitate uniform sputtering of metal atoms from the target 206, and/or deposition of a layer of metal atoms on the wafer 204. As will be discussed further below, the permeance enhanced magnetic assembly 220 may be designed to produce an electromagnetic field that uniformly sputters the target 206 without target puncture, or with reduced occurrence of target punctures.

In operation, a gas, such as argon (Ar) or the like is provided to the process chamber 208 from the gas source. The gas may be provided at a sufficient pressure, such that at least a portion of the gas includes ionized species, such as Ar ions. The ionized species are directed to the target 206 by a DC voltage applied to the target 206 by the DC power supply 210. The ionized species collide with the target 206 to eject metal atoms from the target 206. The metal atoms, for example, having a neutral charge, fall towards the wafer 204 and deposit on the wafer's surface. Concurrently, with the collision of the ionic species with the target 206 and the subsequent ejection of metal atoms, the permeance enhanced magnetic assembly 220 is rotated above the target 206 about the shaft 223 using a motor 225. The permeance enhanced magnetic assembly 220 produces a magnetic field, referred to in operation in certain embodiments as an electromagnetic field, within the chamber 200, generally close to the surface of the target 206 to trap electrons which can collide with and ionize of any gas molecules proximate the target 206, which in turn increases the local ion species density proximate the surface of the target 206 and increases the sputtering rate.

Figure 3A:
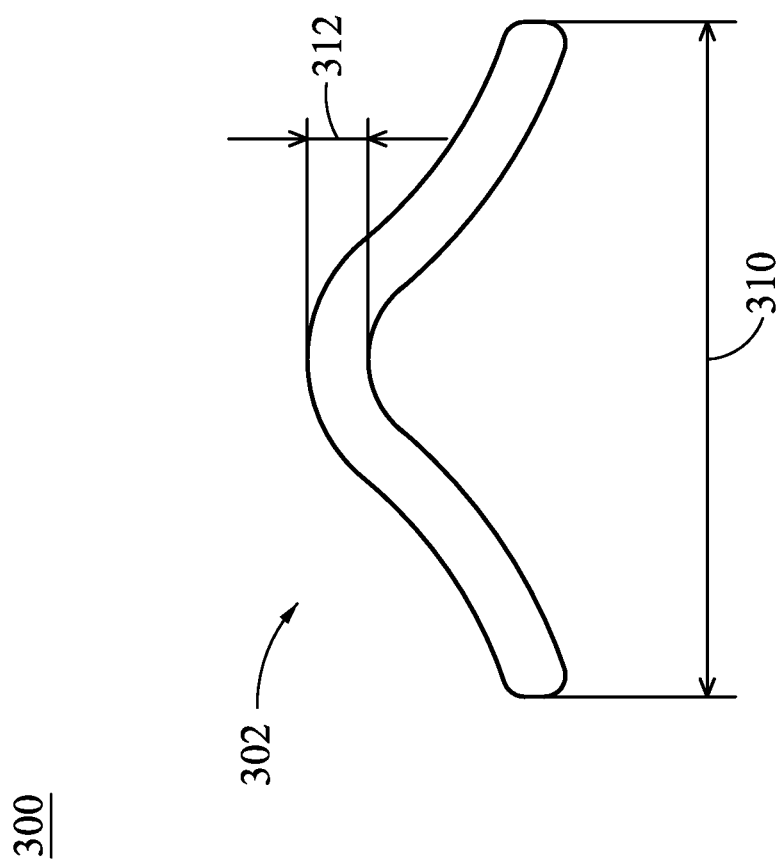
FIG. 3A is a plan view diagram of a separate piece permeance extension structure, in accordance with some embodiments.

FIG. 3A is a plan view diagram 300 of a separate piece permeance extension structure 302, in accordance with some embodiments. As noted above, the separate piece permeance extension structure 302 may be a separate piece configured to be adhered to a main structure of an outer permeance annulus. Stated another way, the main structure may be another piece of the outer permeance annulus to which the separate piece permeance extension structure is adhered to. Accordingly, an outer permeance annulus may be a combination of the main structure and the permeance extension structure.

As noted above, the geometry of the permeance extension structure may be modified as desired to calibrate the strength of the electromagnetic field produced by a permeance enhanced magnetic assembly. In certain embodiments, the curvature of the permeance extension structure may have a radius of curvature of about 9 to about 15. Also, a length 310 of the permeance extension structure may be from about 10 millimeters (mm) to about 80 mm. Furthermore, a width of the permeance extension structure may be from about 3 mm to about 9 mm. Additionally, a thickness of the permeance extension structure may be from about 2 mm to about 9 mm. The thickness may be along an axis orthogonal to the width 312. In certain embodiments, the permeance extension structure 302 may be flush with a corresponding part (e.g., within a permeance enhanced peak region inclusive of a peak) of the main structure of an outer permeance annulus. In particular embodiments, the volume of the permeance extension structure 302 may be about 2 cubic centimeters in volume.

Figure 3B:
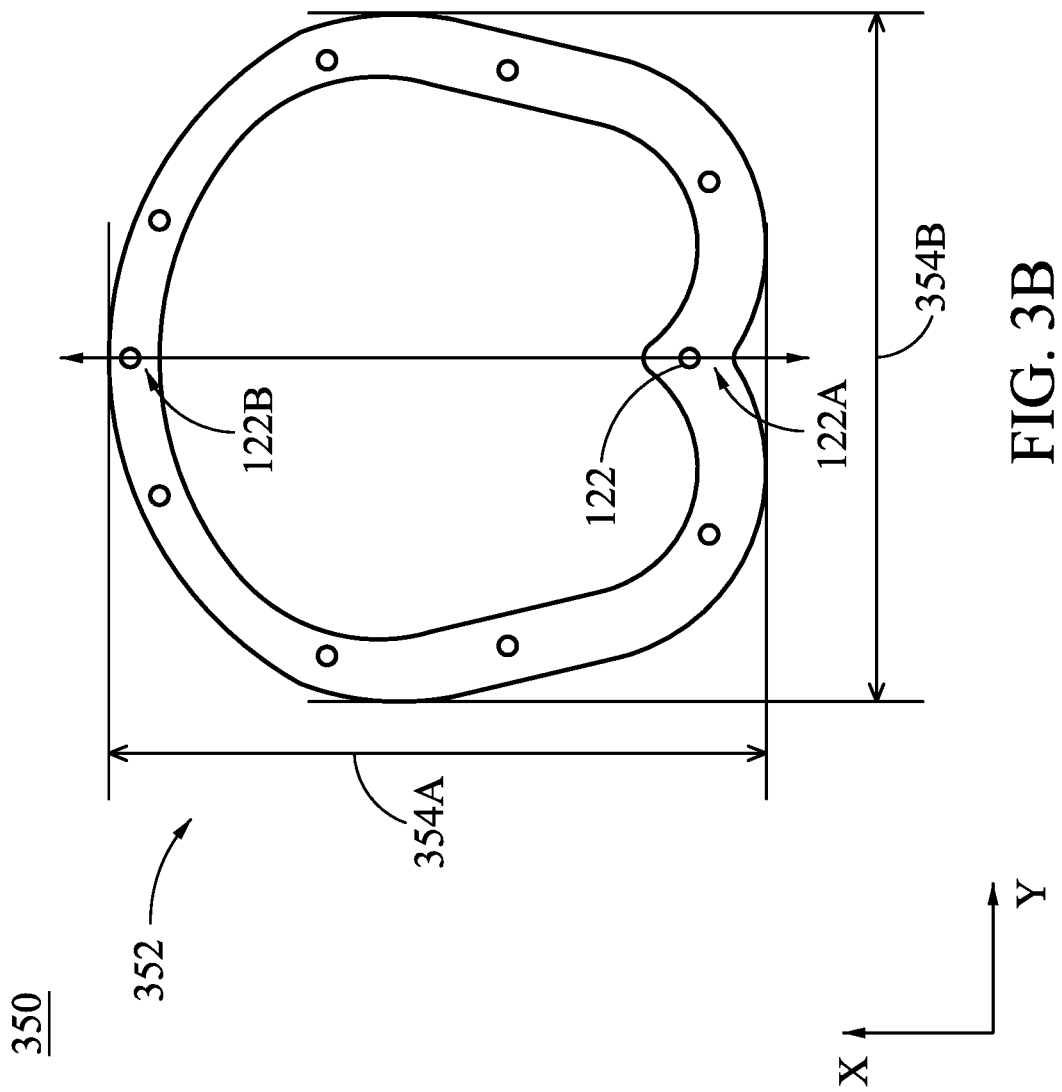
FIG. 3B is a plan view diagram of a main structure of an outer permeance annulus, in accordance with some embodiments.

FIG. 3B is a plan view diagram 350 of a main structure 352 of an outer permeance annulus, in accordance with some embodiments. As noted above, the separate piece permeance extension structure of FIG. 3A may be a separate piece configured to be adhered to the main structure 352 of an outer permeance annulus illustrated in FIG. 3B. Stated another way, the main structure 352 may be another (e.g., separate) piece of the outer permeance annulus to which the separate piece permeance extension structure (discussed above) is adhered to. Accordingly, an outer permeance annulus may be a combination of the main structure 352 and the permeance extension structure.

In certain embodiments, an X axis length 354A of the main structure 352 may be about 230 mm, or from about 100 mm to about 500 mm. A Y axis length 354B of the main structure 352 may be about 265 mm, or from about 100 mm to about 500 mm. Also, a width of the main structure 352 at a bottom width 122A inclusive of the peak along a central axis 122 bisecting the main structure 352 may be about 22.5 mm in certain embodiments and from about 10 mm to about 50 mm in other embodiments. The width of the main structure 352 at a top width 122B not inclusive of the peak along the central axis 122 may be about 16 mm in certain embodiments and from about 1 to about 30 mm in other embodiments. Additionally, a thickness of the permeance extension structure may be about 5.7 mm or within a range of about 2 mm to about 9 mm. The thickness may be along an axis or dimension orthogonal to the width. In certain embodiments, the main structure 352 of the outer permeance annulus may have a volume of about 86.8 cubic centimeters. As noted above, in particular embodiments, the volume of a permeance extension structure may be about 2 cubic centimeters in volume. Accordingly, the volume of the outer permeance annulus may be about 88.9 cubic centimeters. In particular embodiments, the addition of the permeance extension structure may add 2.4 percent additional volume above the volume of the main structure 352.

Figure 4:
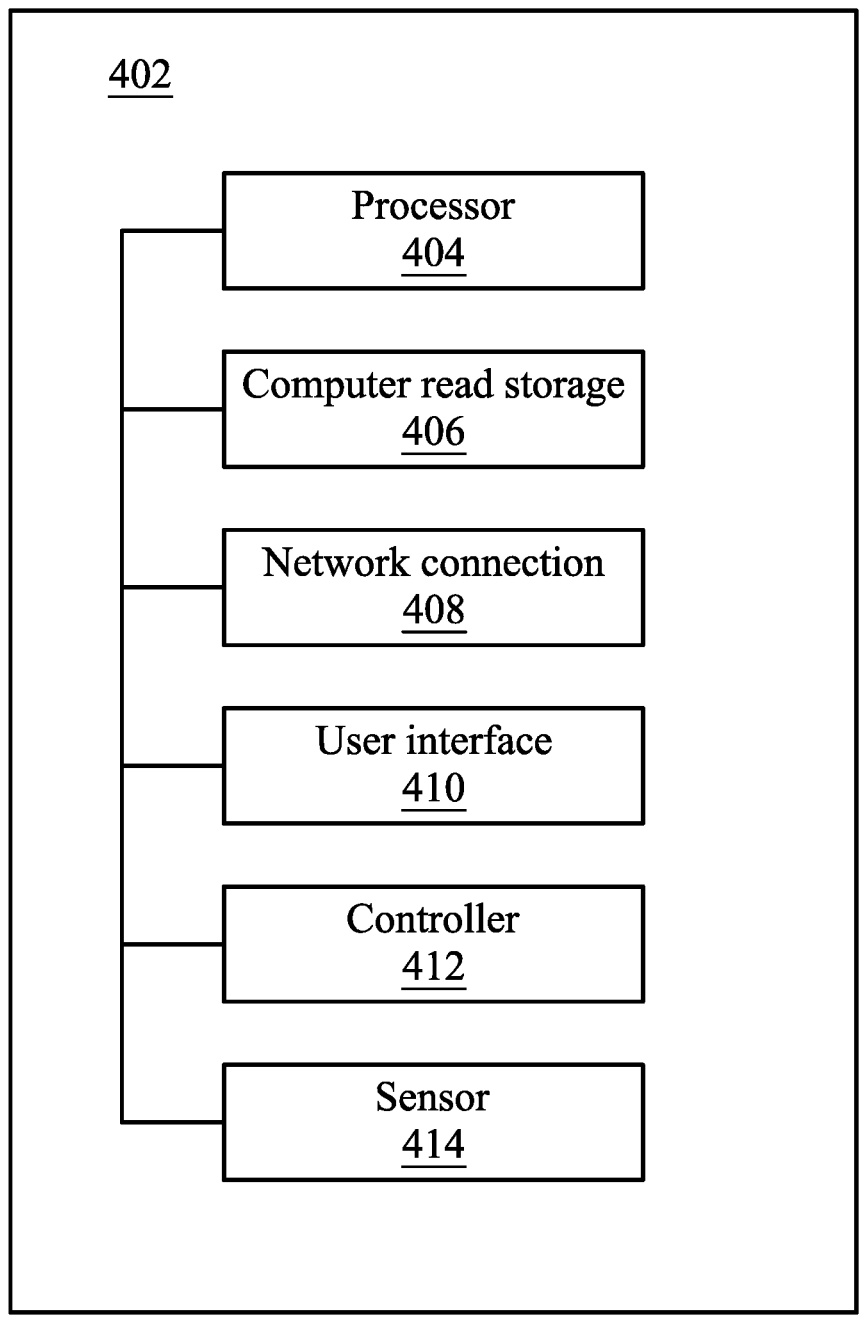
FIG. 4 is a block diagram of various functional modules of a permeance enhanced magnetic assembly physical vapor deposition system, in accordance with some embodiments.

FIG. 4 is a block diagram of various functional modules of a permeance enhanced magnetic assembly PVD system 402, in accordance with some embodiments. The permeance enhanced magnetic assembly PVD system 402 may be part of a PVD chamber that includes a permeance enhanced magnetic assembly, as discussed above. The permeance enhanced magnetic assembly PVD system 402 may include a processor 404. In further embodiments, the processor 404 may be implemented as one or more processors.

The processor 404 may be operatively connected to a computer readable storage module 406 (e.g., a memory and/or data store), a network connection module 408, a user interface module 410, a controller module 412, and a sensor module 414. In some embodiments, the computer readable storage module 406 may include permeance enhanced magnetic assembly operation logic that may configure the processor 404 to perform the various processes discussed herein. The computer readable storage 406 may also store data, such as sensor data characterizing electromagnetic fields within the PVD chamber, magnetic flux through a target, identifiers for a wafer, identifiers for a PVD chamber, identifiers for a semiconductor workpiece fabrication process, identifiers for a target, target erosion profiles, and any other parameter or information that may be utilized to perform the various processes discussed herein.

The network connection module 408 may facilitate a network connection of the permeance enhanced magnetic assembly PVD system 402 with various devices and/or components of the permeance enhanced magnetic assembly PVD system 402 that may communicate (e.g., send signals, messages, instructions, or data) within or external to the permeance enhanced magnetic assembly PVD system 402. In certain embodiments, the network connection module 408 may facilitate a physical connection, such as a line or a bus. In other embodiments, the network connection module 408 may facilitate a wireless connection, such as over a wireless local area network (WLAN) by using a transmitter, receiver, and/or transceiver. For example, the network connection module 408 may facilitate a wireless or wired connection with the processor 404 and the computer readable storage 406.

The permeance enhanced magnetic assembly PVD system 402 may also include a user interface module 410. The user interface may include any type of interface for input and/or output to an operator of the permeance enhanced magnetic assembly PVD system 402, including, but not limited to, a monitor, a laptop computer, a tablet, or a mobile device, etc.

The permeance enhanced magnetic assembly PVD system 402 may include a controller module 412. The controller module 412 may be configured to control various physical apparatuses that control movement or functionality for a wafer, pedestal, electrostatic chuck, vacuum pump, rotational motor, chamber door, or any other controllable aspect of a PVD chamber. For example, the controller module 412 may be configured to control movement or functionality for at least one of a door of the chamber, a rotational motor that rotates a permeance enhanced magnetic assembly around an axis of rotation, and the like. For example, the controller module 412 may control a motor or actuator. The controller may be controlled by the processor and may carry out the various aspects of the various processes discussed herein.

The sensor module 414 may represent a sensor configured to collect sensor data that may be utilized to characterize a target erosion profile. For example, the sensor may represent a sensor configured to characterize electromagnetic fields within the PVD chamber, magnetic flux through a target, target depressions, target punctures, and the like. In certain embodiments, the sensor 414 may be a magnetometer, electric field sensor, an electromagnetic field sensor, a profilometer, or other conventional measuring instrument.

Figure 5:
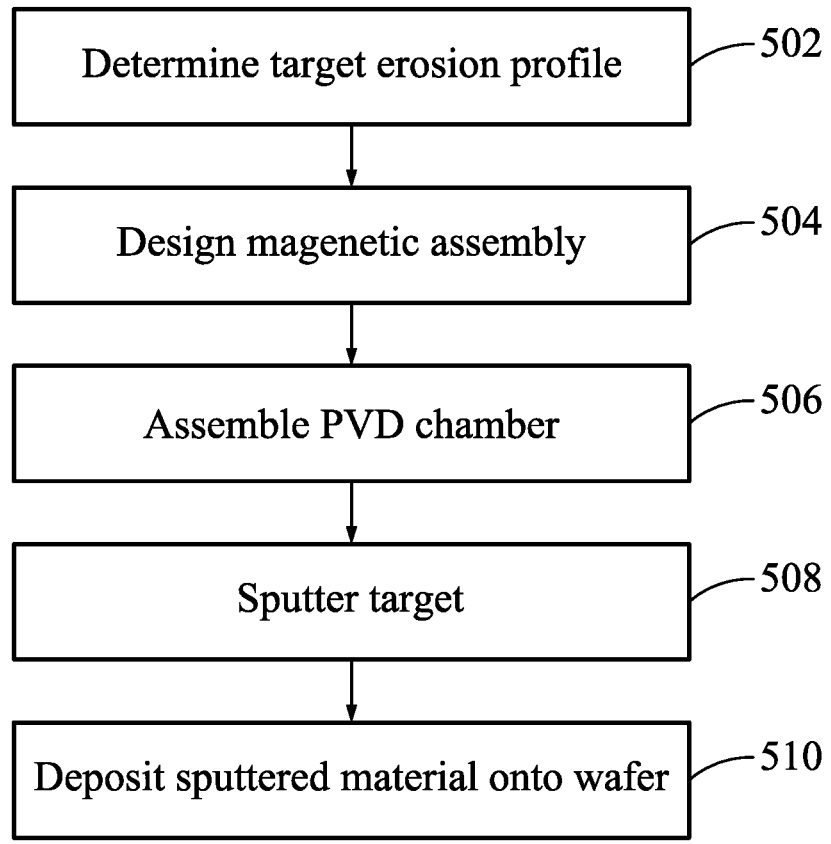
FIG. 5 is a flow chart of a permeance enhanced magnetic assembly physical vapor deposition process, in accordance with some embodiments.

FIG. 5 is a flow chart of a permeance enhanced magnetic assembly PVD process 500, in accordance with some embodiments. The permeance enhanced magnetic assembly PVD process may be performed by a permeance enhanced magnetic assembly PVD system in conjunction with the various components of a PVD chamber (e.g., a permeance enhanced magnetic assembly), as discussed above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, a target erosion profile may be determined. The target erosion profile may characterize electromagnetic interaction with a target within a PVD chamber indicative of target depressions and/or target punctures over time. The target erosion profile may be determined, for example, utilizing the sensor, processor, and computer readable storage discussed above. Specifically, a sensor may be configured to collect sensor data that may characterize electromagnetic fields within the PVD chamber, magnetic flux through a target, target depressions, target punctures, and the like. For example, a measuring instrument may be utilized to measure the electromagnetic field for a given magnetron (e.g., unmodified magnetic assembly), target, and PVD chamber. Also, the same or different measuring instrument may be utilized to measure physical contours on the target over time to confirm specific target depressions and/or target punctures for the given magnetron, target, and PVD chamber. Accordingly, the relationship between the electromagnetic field and target depressions and/or target punctures may be analyzed to determine a target erosion profile for a specific target, magnetron, and PVD chamber.

At operation 504, a permeance enhanced magnetic assembly may be designed to achieve more uniform target erosion and to avoid target punctures. For example, based on the detected target erosion profile, modifications for the unmodified magnetic assembly (e.g., magnetron) used to determine the original target erosion profile of operation 502 may be modeled. This modeling may be used determine modifications that may produce a permeance enhanced magnetic assembly associated with an electromagnetic field that erodes a target evenly via sputtering to avoid target punctures. Specifically, this modeling may be performed by comparing how different modifications of the unmodified magnetic assembly may affect the associated target erosion profile. For example, this modeling may determine whether calibration as an increase and/or decrease in electromagnetic field strength at particular areas would affect a target erosion profile. These increases and/or decreases in electromagnetic field strength may be equated to modifications (e.g., modifications to a geometry) of a permeance extension structure. As noted above, this permeance extension structure may be either a separate piece permeance extension structure that may be adhered to a main structure of an outer permeance annulus or as a continuous part of an outer permeance annulus. In certain embodiments, this modeling may be executed in an automated fashion utilizing conventional computer modeling. In other embodiments, this modeling may be executed manually by manually modifying the geometry of the permeance extension structure and then utilizing sensors to reassess a resultant electromagnetic field and physical contours on the target over time. Based on the modeling, a particular configuration of the permeance enhanced magnetic assembly may be determined to achieve even erosion of the target during sputtering to avoid target punctures. Accordingly, an initial or original target erosion profile for a target may be determined and then modified (e.g., by modifying a permeance enhanced magnetic assembly) to produce a target erosion profile for the target with erosion that avoids target punctures.

At operation 506, a PVD chamber may be assembled with the permeance enhanced magnetic assembly of operation 504 that promotes uniform target erosion and avoids target punctures.

At operation 508, the target may be sputtered using the permeance enhanced magnetic assembly. As discussed above, a gas, such as argon (Ar) or the like may be provided to a process chamber. The gas may be provided at a sufficient pressure, such that at least a portion of the gas includes ionized species, such as Ar ions. The ionized species may be directed to the target by a DC voltage applied to the target. The ionized species may collide with the target to eject metal atoms from the target. The permeance enhanced magnetic assembly may produce an electromagnetic field to trap electrons which can collide with and ionize gas molecules proximate the target, which in turn increases the local ion species density proximate the surface of the target and increases the sputtering rate.

At operation 510, the sputtered target material may be deposited on a wafer within the PVD chamber. As discussed above, the sputtered metal atoms, may fall towards the wafer and deposit on the wafer's surface.

In an embodiment, a magnetic assembly includes: an inner permeance annulus; and an outer permeance annulus connected to the inner permeance annulus via magnets, wherein the outer permeance annulus comprises a peak region with a thickness greater than other regions of the outer permeance annulus.

In another embodiment, a magnetic assembly includes: an inner permeance annulus; and an outer permeance annulus connected to the inner permeance annulus via magnets, wherein the outer permeance annulus comprises a peak region with a concave feature and a convex feature; and a permeance extension structure adhered to the peak region.

In another embodiment, a method includes: producing a magnetic field using a magnetic assembly contained within a chamber, the magnetic assembly comprising: an inner permeance annulus; and an outer permeance annulus connected to the inner permeance annulus via magnets, wherein the outer permeance annulus comprises a peak region with a thickness greater than other regions of the outer permeance annulus; and sputtering a target disposed within the chamber using an electromagnetic field of ions controlled by the magnetic field, such that a material sputtered from the target is deposited onto a wafer within the chamber.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method of making a magnetic assembly, comprising:
   providing an inner permeance annulus within a chamber; and
   connecting an outer permeance annulus to the inner permeance annulus via magnets within the chamber, wherein:
   the outer permeance annulus comprises a peak region having a width greater than other regions of the outer permeance annulus, and
   the outer permeance annulus comprises (a) a main structure that is a single continuous piece and (b) a permeance extension structure that is a separate piece from the main structure.

2. The method of claim 1, wherein the width is along a plane aligned with a surface of the outer permeance annulus, and the outer permeance annulus has a uniform thickness along a dimension orthogonal to the plane.

3. The method of claim 1, wherein the magnets each comprise a respective first end and a second end, wherein the inner permeance annulus is connected to the first end of the magnets and the outer permeance annulus is at the second end of the magnets.

4. The method of claim 3, wherein the first end is a south pole and the second end is a north pole.

5. A method of making a magnetic assembly, comprising:
providing an inner permeance annulus within a chamber; and
connecting an outer permeance annulus to the inner permeance annulus via magnets within the chamber, wherein:
the outer permeance annulus comprises (a) a main structure that is a single continuous piece and (b) a permeance extension structure that is a separate piece from the main structure,
the main structure comprises a peak region with a width greater than other regions of the main structure of the outer permeance annulus,
the width is along a plane aligned with a surface of the outer permeance annulus, and
the main structure of the outer permeance annulus has a uniform thickness along a dimension orthogonal to the plane.

6. The method of claim 5, wherein a tip of the peak region extends more toward the inner permeance annulus than the other regions of the main structure of the outer permeance annulus.

7. The method of claim 5, wherein the peak region is aligned with one of the magnets along an axis that bisects the magnetic assembly.

8. The method of claim 5, wherein the peak region comprises a convex feature that faces a concave feature along the inner permeance annulus.

9. The method of claim 8, wherein the permeance extension structure has a convex shape aligned with the convex feature of the peak region of the main structure of the outer permeance annulus.

10. The method of claim 5, further comprising providing an adhesive material, wherein the permeance extension structure is adhered to the peak region of the main structure of the outer permeance annulus via the adhesive material.

11. The method of claim 5, further comprising providing a mechanical fastener, wherein the permeance extension structure is adhered to the peak region of the main structure of the outer permeance annulus via the mechanical fastener.

12. The method of claim 5, wherein the permeance extension structure has a width smaller than all regions of the main structure of the outer permeance annulus.

13. A method comprising:
providing an inner permeance annulus within a chamber;
connecting an outer permeance annulus to the inner permeance annulus via magnets within the chamber, wherein:
the outer permeance annulus comprises (a) a main structure that is a single continuous piece and (b) a permeance extension structure that is a separate piece from the main structure,
the main structure comprises a peak region with a concave feature and a convex feature, and
the permeance extension structure is adhered to the peak region of the main structure of the outer permeance annulus via an adhesive material.

14. The method of claim 13, wherein the magnetic assembly is configured to rotate around an axis within the chamber to generate an electromagnetic field that moves ions toward a target contained within the chamber.

15. The method of claim 14, wherein the magnetic assembly is configured to rotate around the axis to generate the electromagnetic field with the ions.

16. The method of claim 15, wherein the permeance extension structure has a width smaller than all regions of the main structure of the outer permeance annulus.

17. The method of claim 14, wherein the electromagnetic field is configured to erode the target along an even gradient over time.

18. The method of claim 14, wherein the electromagnetic field is configured to sputter the target without a peak or trough along a surface of the target.

19. The method of claim 13, wherein the permeance extension structure is made of a same material as the main structure of the outer permeance annulus.

20. The method of claim 13, wherein the permeance extension structure is made of a different material than the main structure of the outer permeance annulus.

* * * * *